(12) United States Patent
Marsh et al.

(10) Patent No.: US 7,625,694 B2
(45) Date of Patent: Dec. 1, 2009

(54) SELECTIVE PROVISION OF A DIBLOCK COPOLYMER MATERIAL

(75) Inventors: Eugene P. Marsh, Boise, ID (US); Daryl C. New, Boise, ID (US); Trung T. Doan, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 1117 days.

(21) Appl. No.: 10/840,535

(22) Filed: May 6, 2004

(65) Prior Publication Data

US 2005/0250053 A1   Nov. 10, 2005

(51) Int. Cl.
*B05D 1/36* (2006.01)
*G03F 1/00* (2006.01)

(52) U.S. Cl. .................. 430/323; 430/313; 430/330; 427/472; 427/98.3; 427/385.5

(58) Field of Classification Search ............... None
See application file for complete search history.

(56) References Cited

U.S. PATENT DOCUMENTS

2002/0158342 A1* 10/2002 Tuominen et al. ............ 257/784
2004/0241582 A1* 12/2004 Park et al. .................... 430/296

OTHER PUBLICATIONS

M. Park et al., "Block Copolymer Lithography: Periodic Arrays of ~$10^{11}$ Holes in I Square Centimeter," Science, vol. 276, p. 1401, May 30, 1997).
M. Reed et al., "Molecular Random Access Memory Cell," App. Phys. Lett., vol. 78, No. 22, p. 3735 (Jun. 4, 2001).
G. Hadziioannou, "Semiconductive Block Copolymers for Self-Assembled Photovoltaic Devices," MRS Bull., p. 456 (Jun. 2002).
C. Zhou et al., "Nanoscale Metal/Self-Assembled Monolayer/Metal Heterostructures," App. Phys. Lett., vol. 71, No. 5, p. 611 (Aug. 4, 2001.
IBM Research, "IBM Nanotechnology Announcement at IEDM," published at http://domino.research.ibm.com /Comm/bios.nsf/pages/selfassembly-iedm.html (including animation) (date unknown).
Richard D. Peters et al., "Combining Advanced Lithographic Techniques and Self-Assembly of Thin Films of Diblock Copolymers to Produce Templates for Nanofabrication," J. Vac. Sci. Tech, B 18(6), pp. 3530-34 (Nov./Dec. 2000).
X.M. Lin et al., "Formation of Long-Range-Ordered Nanocrystal Superlattices on Silicon Nitride Substrates," J. Phys. Chem. B 2001, p. 3353-3357 (2001).

* cited by examiner

*Primary Examiner*—Daborah Chacko Davis
(74) *Attorney, Agent, or Firm*—Wong, Cabello, Lutsch, Rutherford & Brucculeri, LLP

(57) ABSTRACT

Disclosed herein are techniques for using diblock copolymer (DBCP) films as etch masks to form small dots or holes in integrated circuit layers. In an embodiment, the DBCP film is deposited on the circuit layer to be etched. Then the DCBP film is confined to define an area of interest in the DCBP film in which hexagonal domains will eventually be formed. Such confinement can constitute masking and exposing the DCBP film using photolithographic techniques. Such masking preferably incorporates knowledge of the domain spacing and/or grain size of the to-be-formed domains in the area of interest to ensure that a predictable number and/or orientation of the domains will result in the area of interest, although this is not strictly necessary in all useful embodiments. Domains are then formed in the area of interest in the DBCP film which comprises a hexagonal array of cylindrical domains in a matrix. The film is then treated (e.g., with osmium or ozone) to render either the domains or the matrix susceptible to removal, while the other component is then used as a mask to etch either dots or holes in the underlying circuit layer.

57 Claims, 10 Drawing Sheets

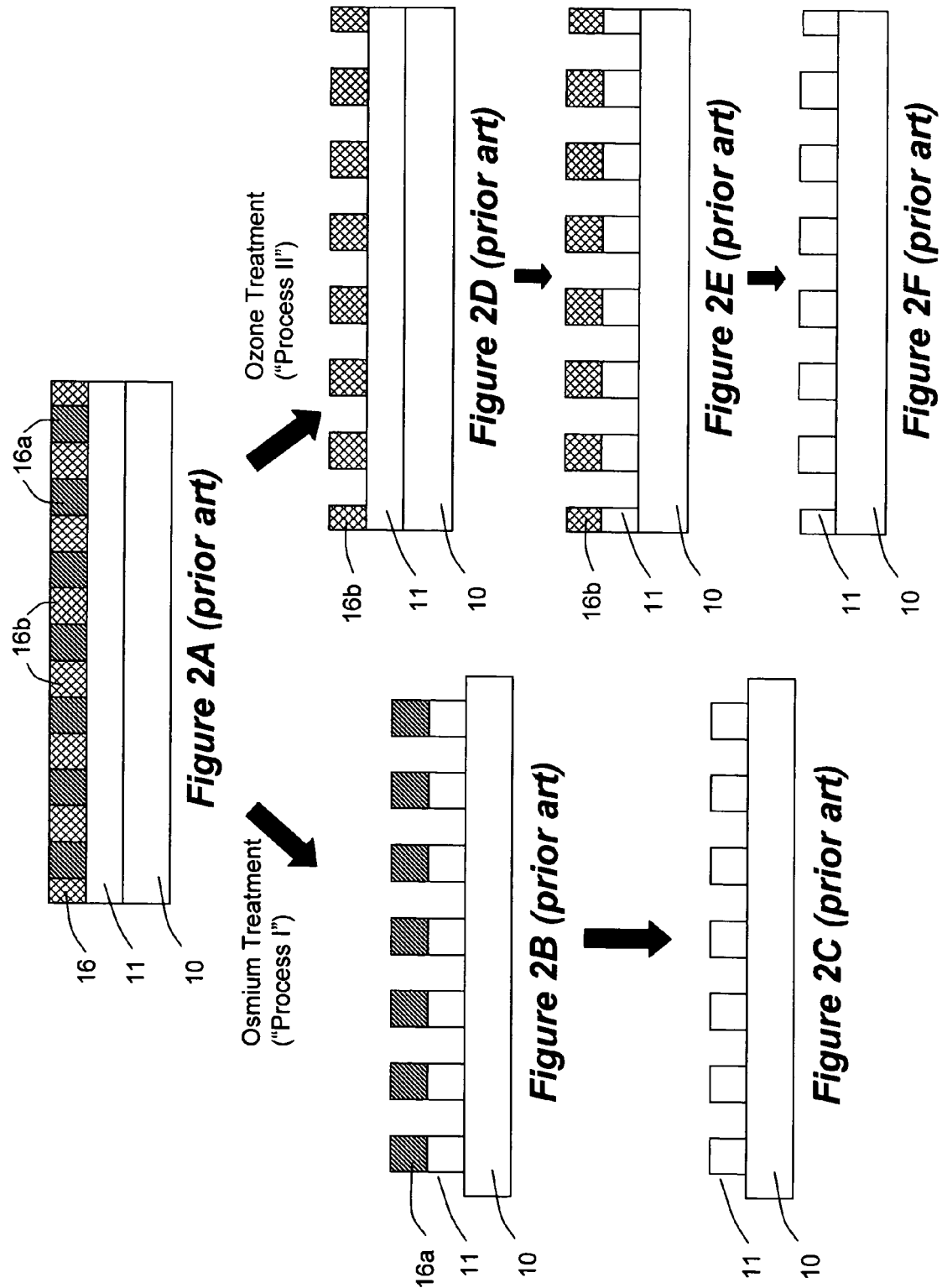

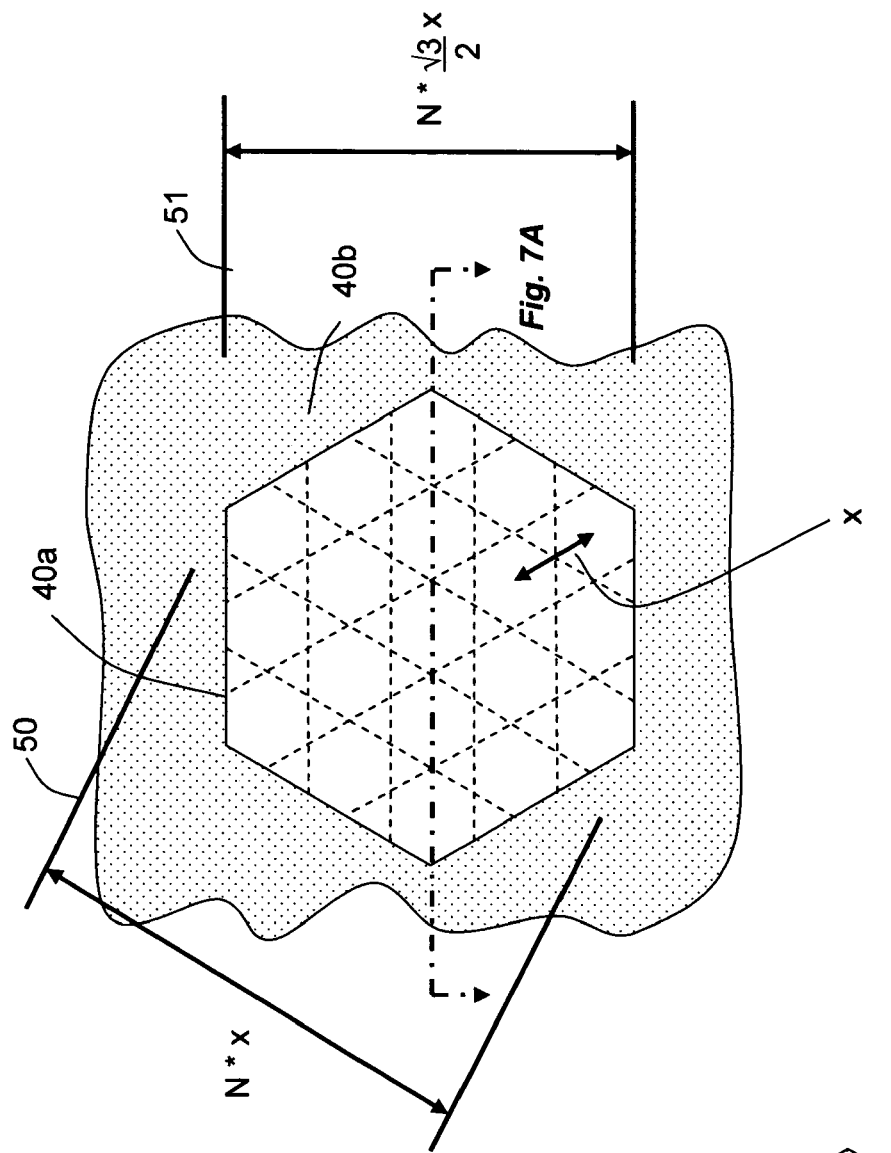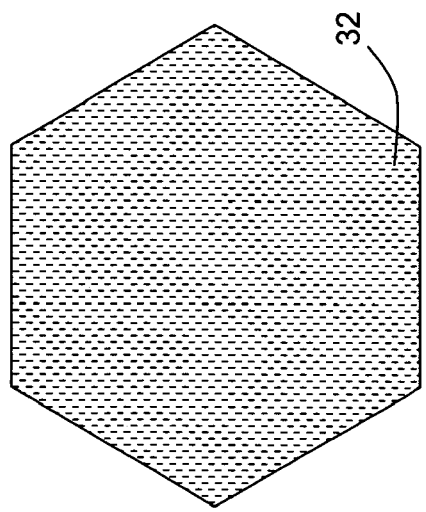
*Figure 7B*

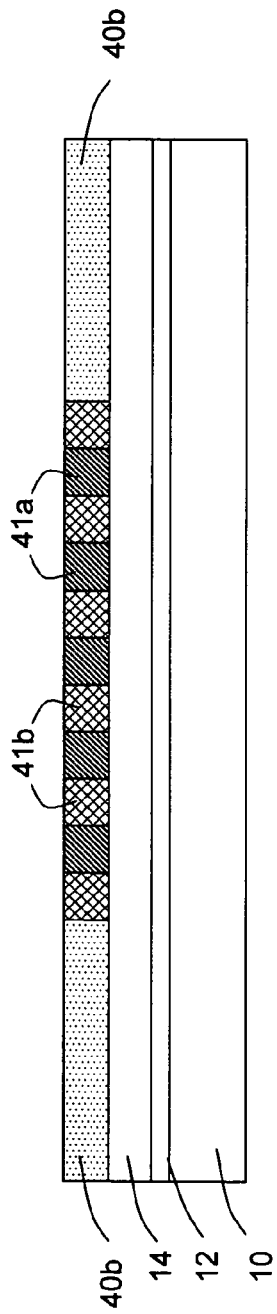
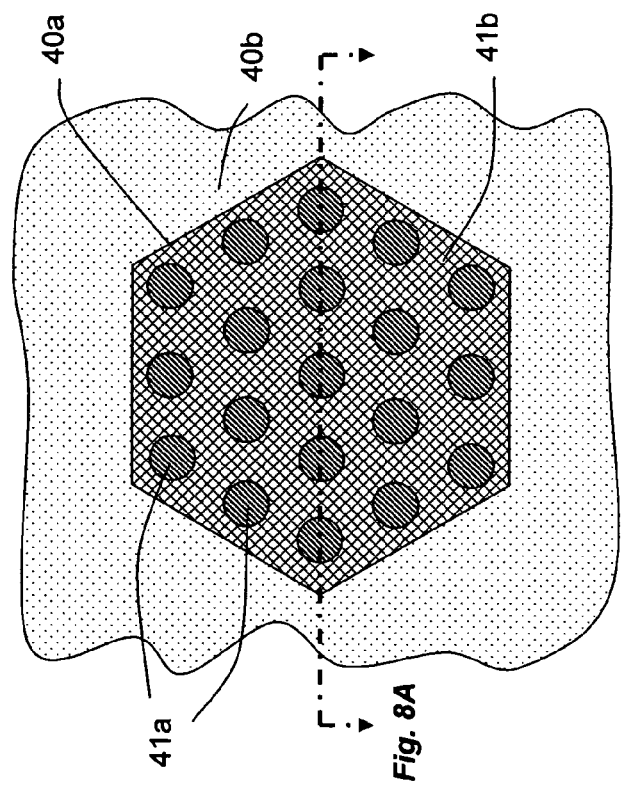

US 7,625,694 B2

SELECTIVE PROVISION OF A DIBLOCK COPOLYMER MATERIAL

FIELD OF THE INVENTION

This invention relates to the use of a diblock copolymer, and particularly to the use of a diblock copolymer selectively provided in a defined area to form a predictable etch mask.

BACKGROUND

As is well known in the field of polymer chemistry, diblock copolymers (DBCPs) comprise molecules having two polymer blocks joined together by a covalent bond. DBCPs can come in many forms, such as those disclosed in M. Park et al., "Block Copolymer Lithography: Periodic Arrays of ~$10^{11}$ Holes in 1 Square Centimeter," Science, Vol. 276, pg. 1401, May 30, 1997) (the "Park Reference"), which is incorporated herein by reference. As disclosed in the Park Reference, DBCPs can include molecules with blocks of polystyrene and polybutadiene (PS-PB), or polystyrene and polyisoprene (PS-PI). Other references disclose DBCP molecules with blocks of polystyrene and polymethylmethacrylate (PS-PMMA), yielding a conjoined molecule having a molecular weight of 70 kg/mol and a 7-to-3 mass ratio of PS to PMMA.

Because the block components are not miscible, the DBCP molecules will tend to align to bring like blocks (or ends of the molecule) together when energy is added to the film. Thus, when the DBCP solution is placed on a support structure (such as a silicon substrate or other film placed thereon), like ends of the molecules will draw together to form small cylindrical domains in the DBCP film. Such domains may be cylindrical or spherical in nature depending on the relative polymer chain lengths and on the surface binding energies. More specifically, the molecules will aligned when the glass transition temperature is exceed for the DBCP film in question (e.g., approximately 125° C. for a PS-PB DBCP).

Such cylindrical domains in a thin film will naturally tend to become as closely packed as possible, and hence generally take on a hexagonal or "honeycomb" appearance in the DBCP film. This is shown in FIG. 1, which shows from a top view cylindrical domains of PB 16a in a matrix of PS 16b. The domains 16a typically have a diameter of approximately 10-20 nanometers ("d"). Moreover, typical domains are spaced from one another at their centers by 40 nanometers ("x"), what is referred to as the domain spacing. The sizes and spacing of the diameters of the domains ("d") as well as the domain spacing ("x") depend on the relative sizes (e.g., chain lengths) the polymers blocks used in the DBCP, and will vary between different DBCP formulations. The exact dimensions "d" and "x" for a given DBCP film are usually well known and can be well tailored for a given application.

Because each of the block components are sensitive to chemicals that the other is not, one of the block components can be selectively removed in the DBCP film, leaving either the cylindrical domains (e.g., of PB) or holes where the cylindrical domains used to appear (e.g., of PS), which provides creative masking solutions for underlying structures.

Exemplary processes for removing one of the block components and for etching an underlying support structure are disclosed in the Park Reference, and are briefly illustrated in FIG. 2. FIG. 2A shows initially that a DBCP layer 16 has been placed on a layer 11 to be etched upon substrate 10. Should it be desired to leave domains 16a (i.e., to remove the PS) as an etch mask, the DBCP layer 16 can be treated with osmium, and more specifically an $OsO_4$ vapor (referred to herein as "Process I"). This treatment "stains" the PB domains 16a by adding osmium across the carbon-carbon double bonds in the PB backbone, making the domains more resilient to the plasma etchant used to etch the underlying layer 11, as shown in FIG. 2B. After such plasma etching, the remaining domains 16a are removed (FIG. 2C), leaving "dots" of layer 11. Should it be desired to remove domains 16a (i.e., to remove the PB) as an etch mask, the DBCP layer 16 can be treated with ozone (referred to herein as "Process II"). Ozone predominantly attacks the carbon-carbon double bonds in the PB domains 16a, cutting the bonds and producing PB fragments that can be removed with water. This results in voids in the PS matrix 16b, thus largely exposing the underlying layer 11 in the locations where the PB domains 16a used to be present (FIG. 2D). The layer 11 can then be plasma etched using the PS matrix 16b as a mask (FIG. 2E). After such plasma etching, the remaining portions of the PS matrix 16b are removed (FIG. 2F), leaving "holes" in layer 11.

While DBCPs can be used in a variety of masking applications to fabricate different types of structures for differing purposes, they find particular utility in the manufacture of memory cells. For example, FIG. 3 demonstrates using a DBCP layer to form flash EPROM memory cells using Process I discussed above. In this example, as shown in FIG. 3A, a silicon crystalline substrate 10 is layered with a tunnel dielectric 12 (e.g., silicon dioxide or nitride) and a polysilicon layer 14. A DBCP layer 16 is deposited on the polysilicon layer 14 and processed to form domains 16a therein. The DBCP layer 16 is treated (with osmium) and the structure is etched (FIG. 3B), thus etching the polysilicon to leave polysilicon dots 14a. Once the domains 16a are removed (FIG. 3C), a control gate dielectric 17 (e.g., silicon dioxide or nitride) is formed over the resulting structure (FIG. 3D). Then a second layer of polysilicon 18 is deposited and etched using traditional patterning and etching techniques (FIG. 3E), and which might have a width (w) as small as 100 nanometers or so. Thus, a flash memory cell is formed, in which charge is selectively storable on the polysilicon dots 14a, which in tandem act like a single floating gate in a traditional flash memory cell and which are controllable by control gate layer 18.

A modification to the process flow for forming a flash memory cell using a DBCP layer and Process II is illustrated in FIG. 4. As shown in FIG. 4A, a thick dielectric layer 12 (which eventually will become in part the tunnel dielectric 12) is formed on the silicon crystalline substrate 10. The DBCP layer 16 is formed on the dielectric layer 12, and again separated into its constituent components 16a and 16b. In this modified process, the PB domains 16a are treated (with ozone) and removed (FIG. 4B). Remaining portions 16b act as the mask for the underlying dielectric layer 12, which is plasma etched to form cylindrical holes 12a whose bottoms constitutes tunnel oxide 12 (FIG. 4C). Thereafter, polysilicon is deposited on the resulting structure and etched back to at least partially fill the cylindrical holes 12a to form polysilicon dots 14a (FIG. 4D). Then the control gate dielectric 17 is deposited (FIG. 4E) and the control gate layer 18 of polysilicon is patterned and etched (FIG. 4F).

However, while useful as masking layers, DBCP films as used in the prior art are not ideal, especially when applied to the formation of memory cells such as those illustrated above. First, the number of cylindrical domains formed in the patterned layer (e.g., polysilicon domains 14a) will not always appear in a predictable relationship with respect to other structures traditionally patterned elsewhere on the device. For example, and referring to FIG. 5A, the relationship between the polysilicon dots 14a and the overlying control gate 18 (in dotted lines) are shown. As can be seen, the control gate 18 does not entirely cover a discrete number of polysilicon dots 14a: some dots 14a (e.g., 19) are only partially covered by the control gate 18 at its edge. Thus, as alignment varies from control gate to control gate (or from device to device), the numbers of polysilicon dots 14a covered (and thus affected) by the control gate 18, and/or the extent of that coverage, will change. Even if the control gate could be consistently aligned and patterned with extreme precision (+/−1 nanometer or so), the position of the polysilicon dots 14a will change from control gate to control gate because they are defined by the DBCP film, which in turns grows its domains at random starting locations on the device. The effect is that each control gate 18 (or memory cell) will have slightly different electrical properties due to the different numbers and orientations of the dots 14a. Such variability in the finished device is of course not optimal.

Another problem (which exacerbates the first) is that the domains in the DBCP layer will not form on the device with perfect uniformity. In this regard, the DBCP layer is akin to polycrystals. Thus, the DBCP layer will establish local regions of perfect order, or "grains" 20, but on the whole will have inconsistency in its ordering, as is shown in FIG. 5B. (Typically, the grain size of such grains 20 may be on the order of ten domains or so, but this is variable and depends on the temperatures and times used during domain formation). Thus, it is seen that the DBCP layer in FIG. 5B (as reflected in the eventual locations of the polysilicon dots 14a) had at least three fairly distinct grains 20a-20c defining grain boundaries 21 in between. More generally however (and possibly as a result of grain formation), certain domains or areas of domains 22 are disordered when compared to the predominant local ordering that is present. The salient point is that the domains in the DBCP layer, and hence resulting structures etched thereby such as the polysilicon dots 14a, will vary in their order. Again, this injects variance into devices formed using such structures (e.g., memory cells), as each control gate 18 may have slightly different numbers or arrangements of polysilicon dots 14a that it can influence (or that it is influenced by).

Richard D. Peters et al., "Combining Advanced Lithographic Techniques and Self-Assembly of Thin Films of Diblock Copolymers to Produce Templates for Nanofabrication," J. Vac. Sci. Tech, B 18(6), pp. 3530-34 (November/December 2000), which is hereby incorporated by reference, suggests a method to more accurately order the domains as they form in the matrix. In Peters, a substrate was treated with an "imaging layer," such as an alkylsiloxane layer. The imaging layer is patterned using extreme ultra-violet (EUV) or X-ray radiation to form chemically-altered stripes whose period roughly match that of the domain spacing, x. Because these chemically-altered stripes selectively wet to the domains, the domains will tend to form above them, leaving the matrix portions of the copolymer in the unexposed portions of the imaging layer between the chemically-altered stripes (anti-stripes). The diblock copolymer is then formed over the imaging layer and heated to promote domain formation, such that the domains form in straight lines over the chemically-altered stripes, and the matrix portion forms in straight lines over the anti-stripes. Then, either the domains or the matrix are removed, and used as a template.

However, Peters' approach is not suitable for some applications. First, it requires the use of an imaging layer, which introduces potential contamination and complexity to the process. Second, while promoting domain order, such domain ordering is formed along straight lines. This is useful for patterning lines in the underlying circuit layer, but not dots or holes, and thus is not useful in all applications.

SUMMARY

Disclosed herein are techniques for using diblock copolymer (DBCP) films as etch masks to form small dots or holes in integrated circuit layers. In an embodiment, the DBCP film is deposited on the circuit layer to be etched. Then the DCBP film is confined to define an area of interest in the DCBP film in which hexagonal domains will eventually be formed. Such confinement can constitute masking and exposing the DCBP film using photolithographic techniques. Such masking preferably incorporates knowledge of the domain spacing and/or grain size of the to-be-formed domains in the area of interest to ensure that a predictable number and/or orientation of the domains will result in the area of interest, although this is not strictly necessary in all useful embodiments. Domains are then formed in the area of interest in the DBCP film which comprises a hexagonal array of cylindrical domains in a matrix. The film is then treated (e.g., with osmium or ozone) to render either the domains or the matrix susceptible to removal, while the other component is then used as a mask to etch either dots or holes in the underlying circuit layer. The disclosed process is particularly useful in the formation of flash EPROM cells, but has other uses in integrated processes benefiting from arrays of well-aligned dots or holes.

BRIEF DESCRIPTION OF THE DRAWINGS

Embodiments of the inventive aspects of this disclosure will be best understood with reference to the following detailed description, when read in conjunction with the accompanying drawings, in which:

FIGS. 2A-2F illustrate prior art processes for using the DBCP film as a mask to pattern either small dots or small holes in an underlying film.

FIGS. 6-11B illustrate an exemplary process for forming a flash EPROM cell using a confined area of a DBCP film.

DETAILED DESCRIPTION

FIGS. 6-11B illustrates a process for using a diblock copolymer (DBCP) film as a mask to form domains in a controlled manner and in a confined region. The confined region is preferably sized and shaped so that a predictable number of domains are formed. Because the confined region is relatively small in size, the possibility of domains forming in a non-uniform manner (e.g., with grain boundaries or other non-uniformities) is reduced. Moreover, the disclosed process is also beneficial in that structures, such as control gate, will not affect (or by affected by) the presence of partial domains at the edges of such structures. In the context of fabricating a Flash EPROM cell, which illustrates an exemplary device whose fabrication is assisted by the disclosed processing techniques, the result is a controlled, well-ordered, non-partial domain structure that will improve cell-to-cell uniformity and that exhibits improved predictability in the electrical behavior in the finished cell.

The exemplary process for FIGS. 6-11B employs processing the DBCP layer according to Process I as discussed earlier. However, one skilled in the art will realize that Process II could also be used, although it is not illustrated.

Figure 6:
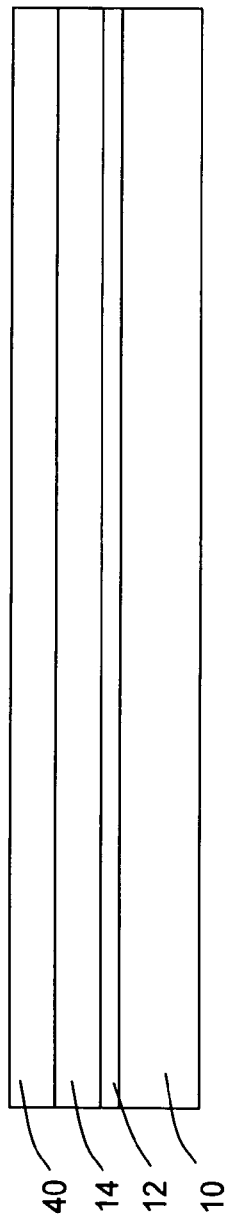
Figure 7A:
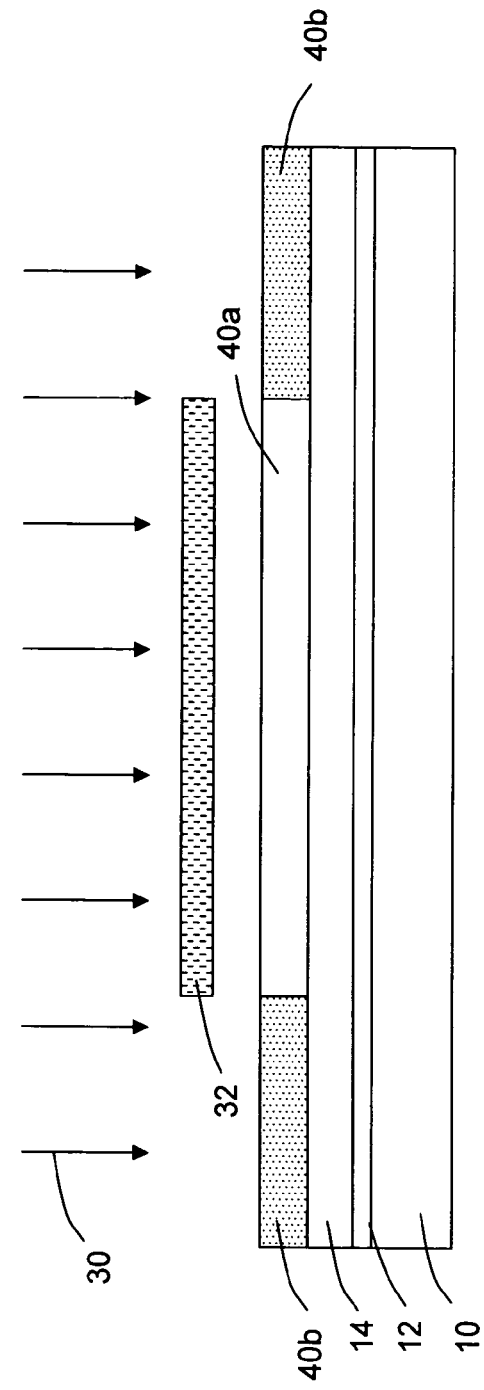

FIG. 6 shows a silicon substrate 10, a gate oxide 12, and a presently unpatterned polysilicon layer 14. A DBCP layer 16 has been placed on to the wafer, e.g., by spinning it in a toluene solution to a thickness of 50 nm or so. The DBCP layer 40 is then patterned using radiation 30 and an etch mask 32, as shown in FIG. 7A. (The radiation 30 and etch mask 32 can be those typically used in semiconductor processing). In so doing, portions 40b of the DBCP layer become degraded by the radiation 30; other portions (area of interest) 40a protected by the mask 32 remain unaffected. As will be seen, polysilicon dots 14a will eventually be formed underneath the area of interest 40a.

Figure 1:
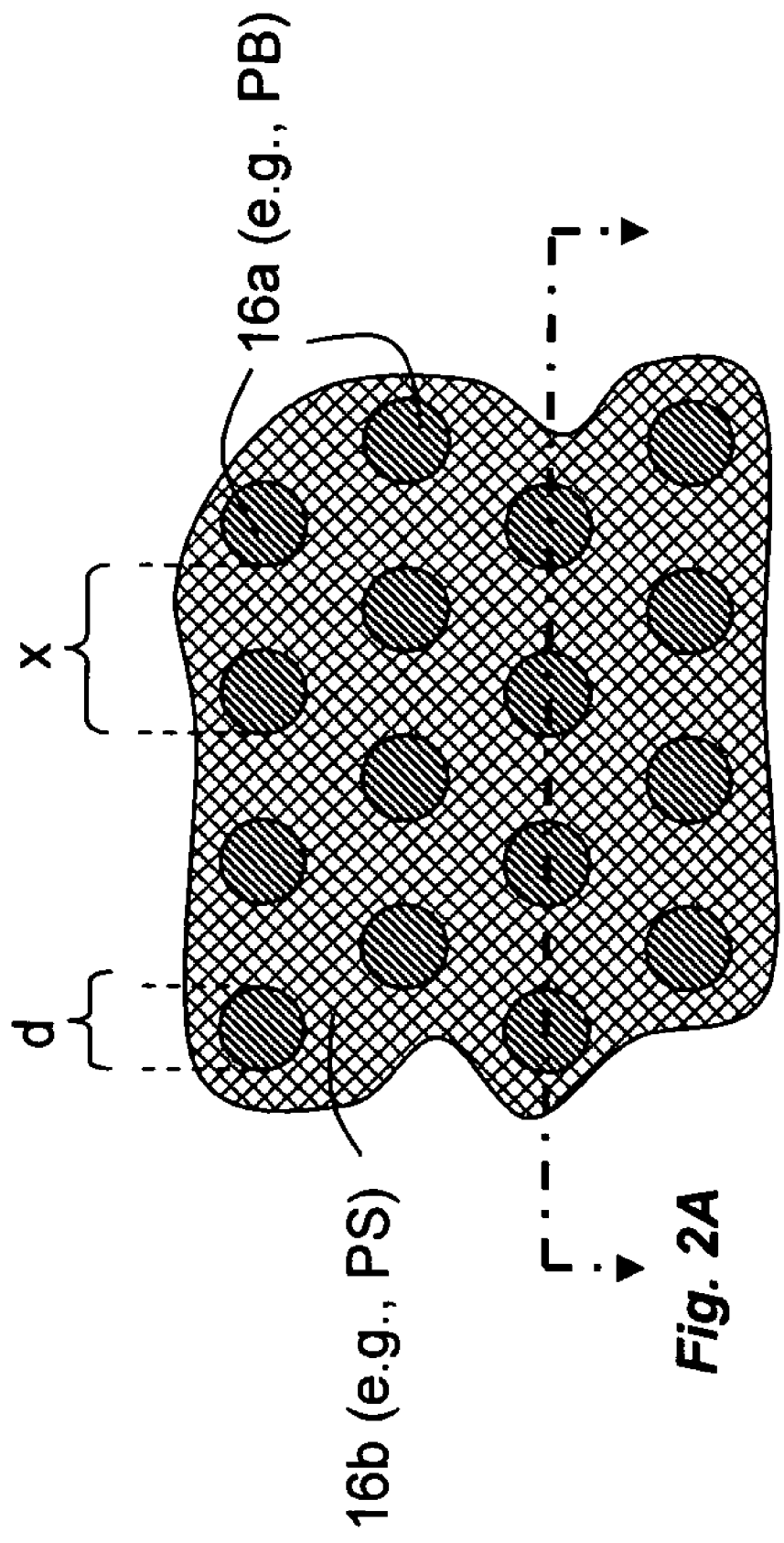
FIG. 1 illustrates a prior art diblock copolymer (DBCP) film and the formation of cylindrical domains.
Figure 3A:
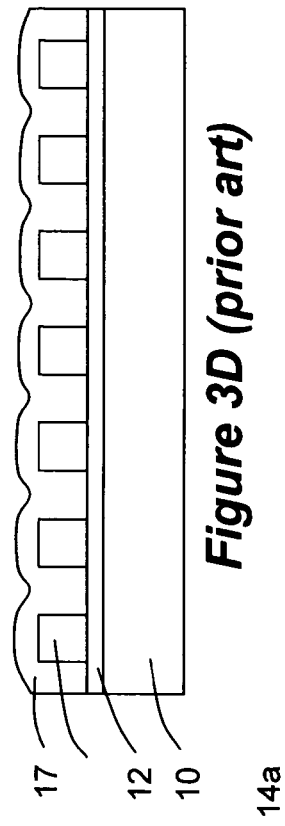
FIGS. 3A-3E illustrate a prior art process for forming a Flash EPROM memory cell using a DBCP film.
Figure 3B:
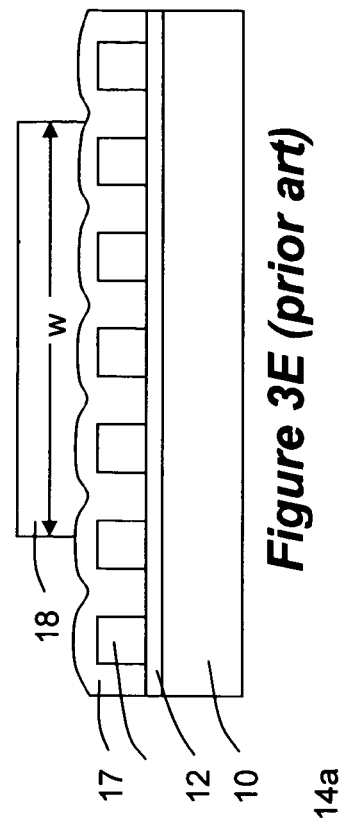
Figure 3C:
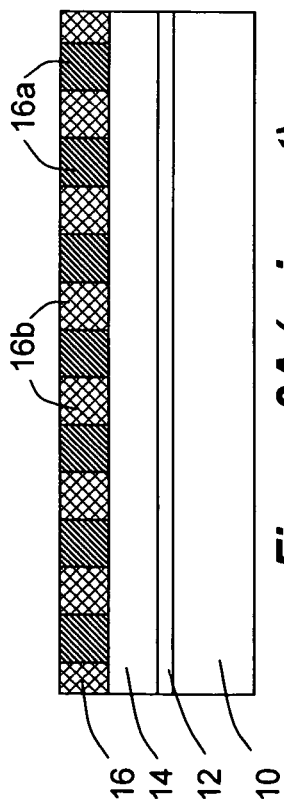
Figure 3D:
Figure 3E:
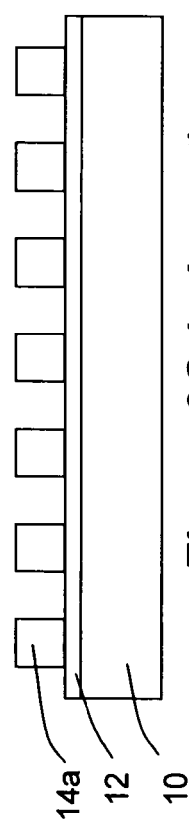
Figure 4A:
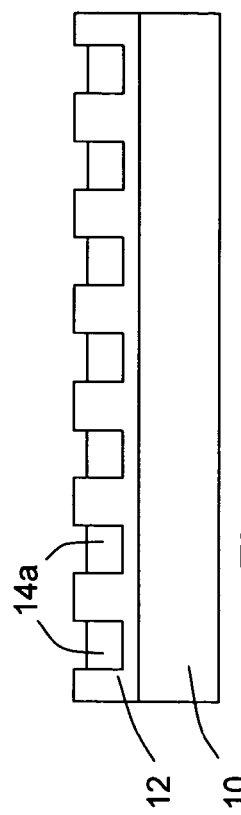
FIGS. 4A-4F illustrate a modified prior art process for forming a Flash EPROM memory cell using a DBCP film.
Figure 4B:
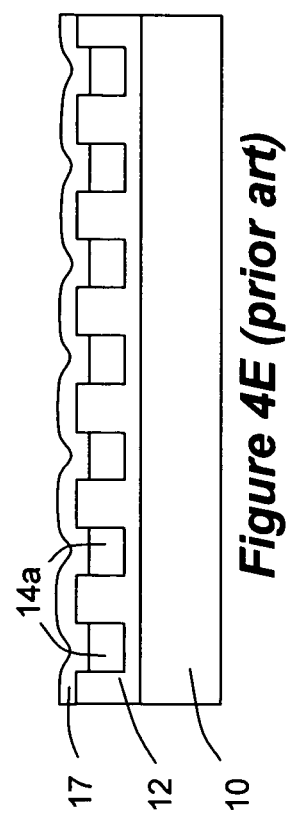
Figure 4C:
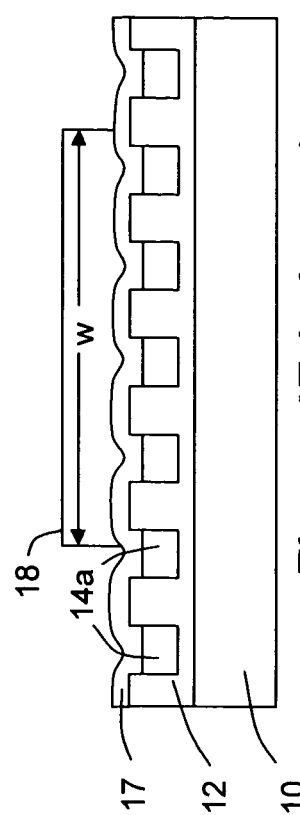
Figure 4D:
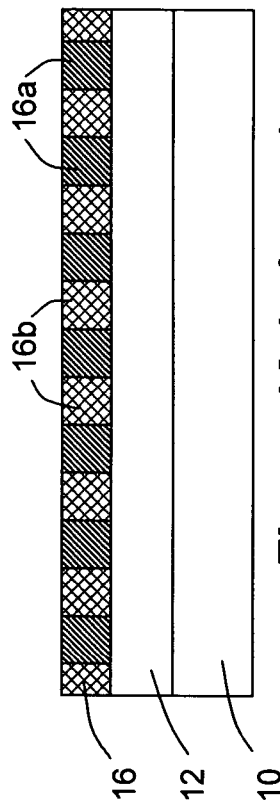
Figure 4E:
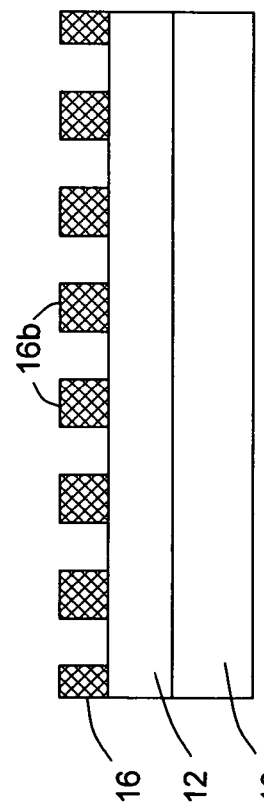
Figure 4F:
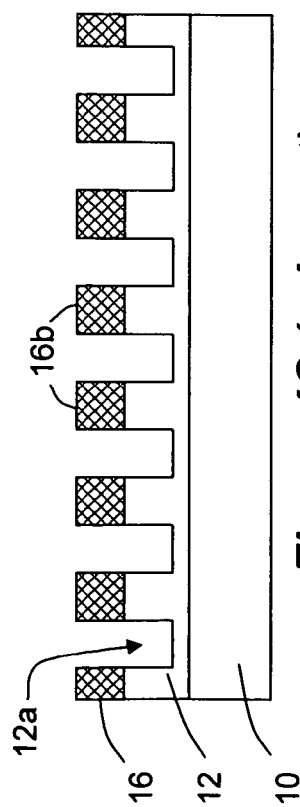

FIG. 7B shows further details of the mask 32 and the area of interest 40a. One preferable aspect of the disclosed technique is to ensure that the polysilicon dots 14a eventually formed in the area of interest are uniform and well ordered. As noted earlier, this would give rise to devices (e.g., flash memory cells) with more predictable performance. To achieve this result, knowledge of the domain spacing (see FIG. 1; "x") that will eventually be formed in the DBCP layer 40 is beneficial. As noted earlier, the domain spacing "x" is generally well known for a given DBCP formulation, and/or the domain spacing can be experimentally determined for a given formulation and thickness.

In any event, knowing the domain spacing "x" before hand, the extent of the area of interest 40a, and hence the extent of the mask 32 to be used, can be confined so that a set number of domains will form in the area. As noted earlier, the domains in the DBCP layer 40 will preferably form in a hexagonal pattern, and (for a given formulation) with a domain spacing of "x" between the domains. Knowing this, the area of interest 40a can be tailored so that a discrete number of domains will form within the area of interest. For example, and as shown in FIG. 7B, assume that the area of interest 40a is hexagonal in shape, which is a particularly beneficial shape because the to-be-formed domains will naturally match this shape. By defining the area of interest 40a to include a discrete and quantized number of these domains, it likely that the domains will form in the DBCP layer 40 in an ordered and predictable fashion, especially if the area of interest is smaller than the normally-exhibited grain size (see FIG. 5B; 20) for the film.

Thus the area of interest 40a has been defined so as to include 19 potential domains (more specifically two rows of three domains, two rows of four domains, and a row of five domains. Using geometry, it can be seen that the area of interest 40 thus must be 5*x along its longest diameter 50, and 5*√3/2*x along its shortest diameter 51. FIG. 7B shows these dimensions more generically to include N numbers of domains along these diameters.

Of course, constraining the area of interest 40a in this fashion is ultimately accomplished by appropriate sizing and shaping of the mask 32. However, it is not necessary that the mask 32 need exactly match the size and shape of the patterned area of interest 40a, although this is shown for ease of understanding. As one skilled in the art will recognize, masks 32 are often made larger than the desired area to be patterned (e.g., 5 or 10 times larger), and then scaled down by optics to the appropriate size for patterning. Moreover, other structures may be added to masks 32 (not shown) to reduce diffractive effects and to allow for crisp patterning, and which will change the shape of the mask relative to the to-be-patterned area 40a. In any event, what is critical is to ensure that the patterned area of interest 40a is well defined and well constrained, and those skilled in the art will know how to make an appropriate mask 32 to achieve that result.

Note that the area of interest 40a, measuring approximately 200 nm at its largest diameter 50, is relatively small in the sense that it can encompass a relatively small number of domains (e.g., a maximum length of five as shown). This is beneficial because the domains are likely to form uniformly because the number of domains is less than would normally appear in a grain (FIG. 5B; 20) of the DBCP layer were that layer unbounded. However, the area of interest 40a is also suitably large to be patterned by traditional photolithography techniques.

This being said however, a relatively large and traditionally-patternable area of interest 40a and/or the area of interest encompassing a relatively small number of domains are not limitations of the disclosed technique. Benefits are had through use of the disclosed technique even should grain boundaries eventually form in the area of interest 40a. For example, even if large areas of interest 40a are formed, and even if grain boundaries are formed, the area of interest 40a will still likely contain a predictable, quantized number of domains, and in any event will not exhibit any partial domains at its edges. Likewise, benefits exist even if the area of interest is quite small and not patternable using traditional techniques. For example, using more advanced techniques, areas of interest as small as a few domains, or even a single domain, are possible.

The area of interest 40a is shown as hexagonal in shape, which as noted provides a natural match for the way the domains would preferably align themselves. However, it should be noted that this is not strictly necessary. Other shapes could be formed as well, including more traditional squares or rectangles. In this regard, although the domains may not form in such areas with perfect ordering, the ordering exhibited is expected to be predictable even if not perfect by virtue of confining the area of interest 40a. Moreover, even in a non-hexagonal area, predictable numbers of complete non-partial domains should form, promoting device uniformity. Routine experimentation may be required for a given area of interest shape to empirically determine the nature of domain formation.

After patterning the areas of interest 40a, the exposed portions 40b of the DBCP layer 40 can either be removed using traditional photolithography stripping techniques (FIG. 9), or can remain and be removed later after domain formation, or after the domains are treated (with osmium or ozone). (FIG. 8A shown portions 40b remaining).

Next, and still referring to FIG. 8A, the DBCP layer 40, and specifically the area of interest portion 40a of that layer, are heated to promote domain 41a formation. As described earlier, this requires the DBCP layer 40 to be heated beyond the glass transition temperature for the formulation in question, normally above 125° C. If portions 40b still remain at this time, they will not phase segregate upon heating. For the exemplary hexagonal area of interest 40a, the result of domain formation is shown in FIG. 8B, which shows from a top view that the domains have formed with good ordering and in a predictable number. Again, this results from tailoring the size of the area of interest 40 with knowledge of the domain spacing "x" and/or forming the area of interest 40a smaller than a typical DBCP grain size, as discussed earlier.

Figure 9:
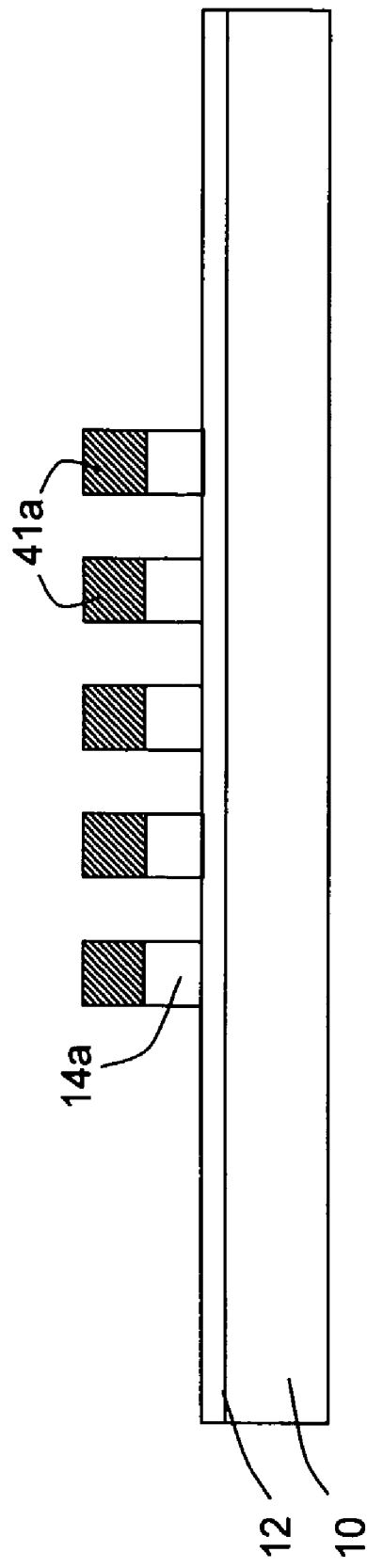
Figure 10:
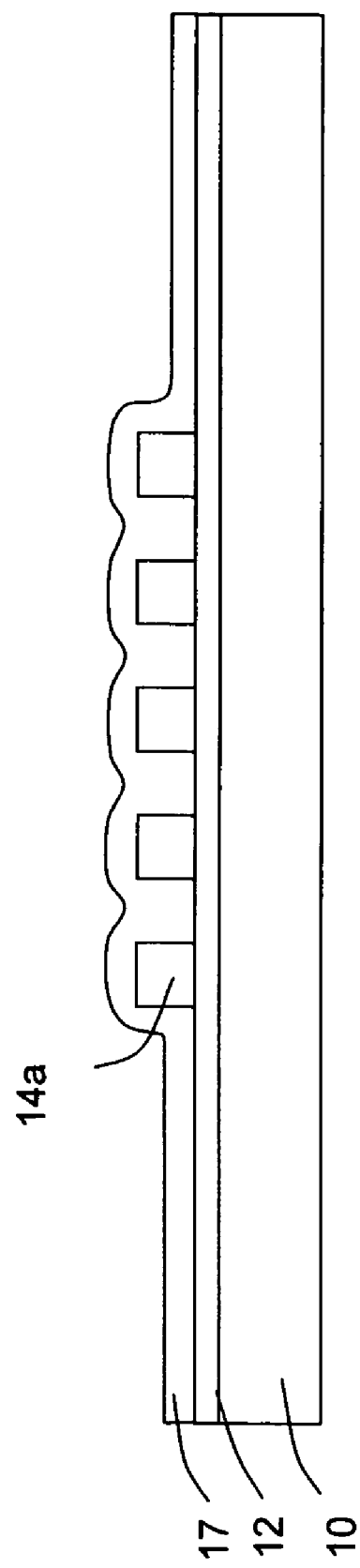
Figure 11A:
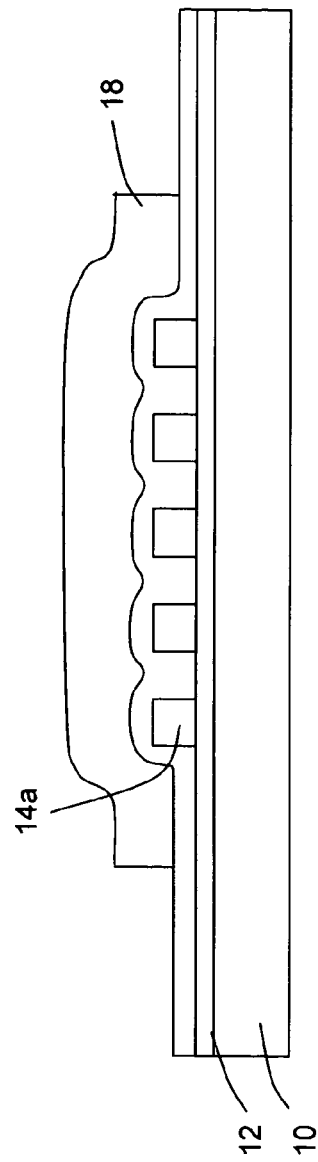

After treatment (with osmium) to etch-harden the domains 41a pursuant to Process I, the resulting structure is plasma etched to selectively remove the polysilicon layer 14 to form polysilicon dots 14a, as shown in FIG. 9. As noted above, osmium treatment makes domains 41a (e.g., PB) more resilient to plasma etching than non-domain portions 41b (e.g., PS). Then domains 41a are removed, and a control gate dielectric 17 is formed (FIG. 10). Thereafter, the control gate 18 can be patterned over the polysilicon dots 14a and etched, as shown in FIG. 11A. Although shown as hexagonal in shape, the control gate 18 can take on other shapes (e.g., rectangular), even if the underlying polysilicon dots 14a were patterned within a different shape. At this point, processing continues to finish fabrication of the device. For example, the control gate 18 can be used as an ion implantation mask to form N+ source/drain regions for the formed transistors. (One skilled in the art will also appreciate that isolation regions formed in or on the silicon substrate 10 would also normally be present and useful to define the source/drain regions, but these have not been shown because such structures are well known and not useful to illustrate the disclosed inventive techniques).

Figure 5B:
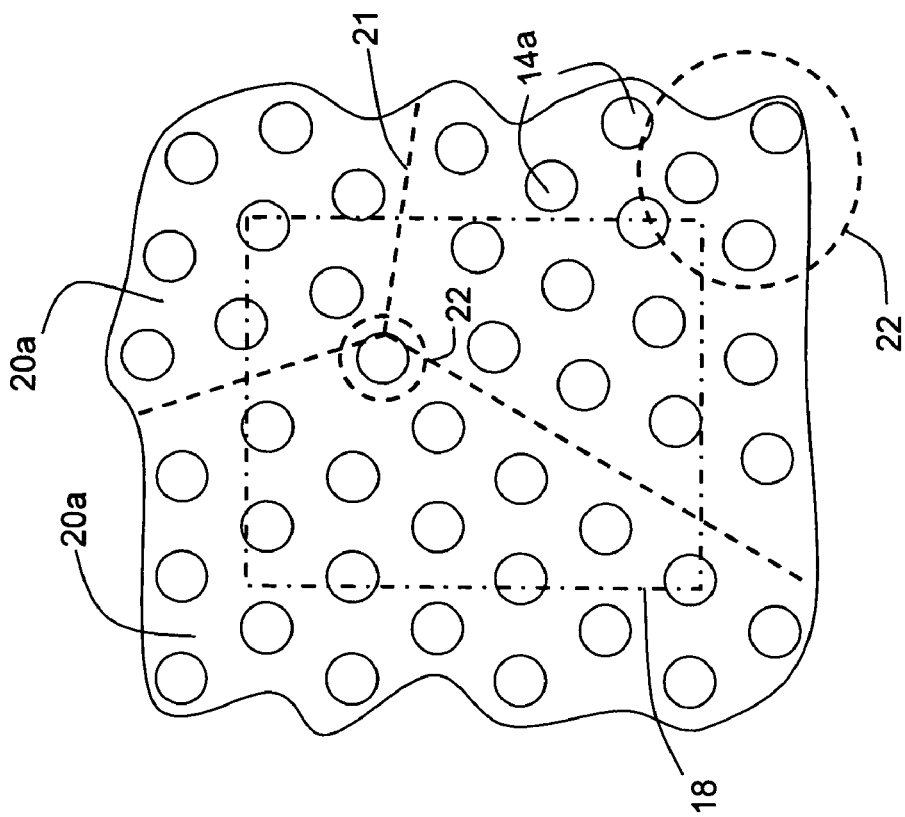
FIGS. 5A and 5B illustrate problems with the prior art processes of FIGS. 3A-3E and 4A-4F, specifically problems with partial domain overlap, the formation of grains, and unpredictability in the number of domains formed when compared to an overlying control gate.
Figure 5A:
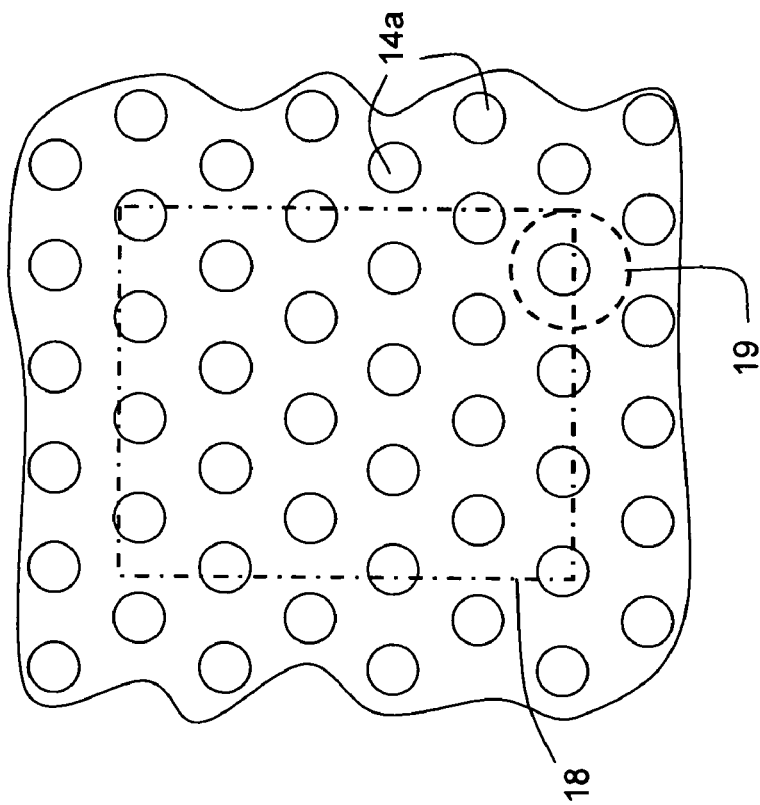
Figure 11B:
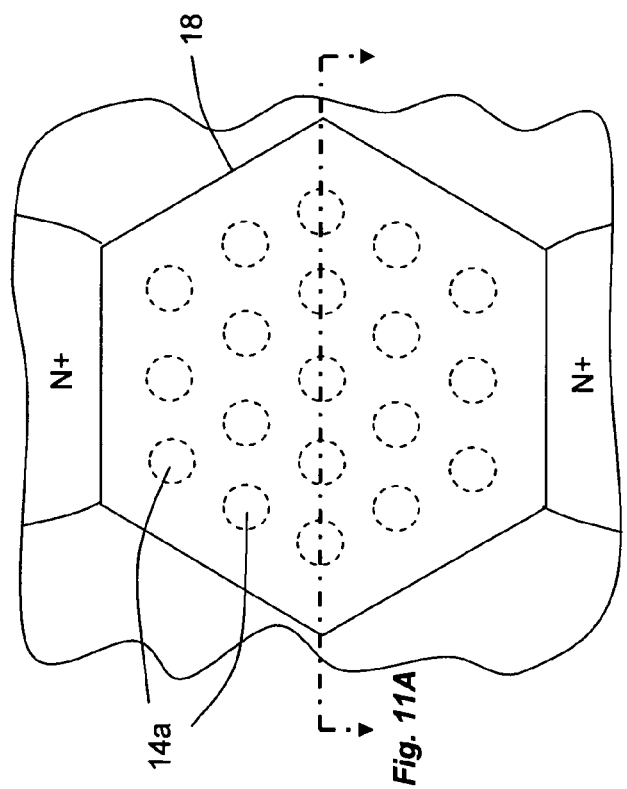

A comparison of FIG. 11B with the prior art illustrations of FIGS. 5A and 5B show the utility of the disclosed technique. First, it is seen that a predictable number of polysilicon dots 14a appear within the confines of the control gate 18 using the disclosed technique. Moreover, the dots 14a do not appear only partially within the confines of the control gate 18 (i.e., at its edges). Lastly, the dots 14a are well ordered within the control gate 18. In sum, a device with improved performance predictability results.

The disclosed technique allowing for selective provision of a DBCP layer has been illustrated in the context of the fabrication of a flash memory cell. However, other structures and devices requiring small ordered dots of material ("Process I"), or ordered holes ("Process II"), can benefit from the disclosed technique, such as but not limited to those disclosed in the Park Reference cited earlier.

Although in a preferred embodiment diblock coplymers are used, other types of block copolymers could be used as well (e.g., triblock copolymers with a middle block for joining the two primary blocks of interest).

Moreover, while disclosed herein as being usable as a plasma etch mask, it should be understood that the DBCP layer can be used with wet etchants as well.

Other references disclosing DBCPs and having relevance to the present disclosure, and which are incorporated herein by reference, include: M. Reed et al., "Molecular Random Access Memory Cell," App. Phys. Lett., Vol. 78, No. 22, pg. 3735 (Jun. 4, 2001); G. Hadziioannou, "Semiconductive Block Copolymers for Self-Assembled Photovoltaic Devices," MRS Bull., pg. 456 (June 2002); C. Zhou et al., "Nanoscale Metal/Self-Assembled Monolayer/Metal Heterostructures," App. Phys. Lett., Vol. 71, No. 5, pg. 611 (Aug. 4, 2001); and IBM Research, "IBM Nanotechnology Announcement at IEDM," published at http://domino.research.ibm.com/Comm/bios.nsf/pages/selfassembly-iedm.html (including animation) (date unknown).

It should be understood that the inventive concepts disclosed herein are capable of many modifications. To the extent such modifications fall within the scope of the appended claims and their equivalents, they are intended to be covered by this patent.

What is claimed is:

1. A method for processing a block copolymer, comprising in order:
   forming the block copolymer over a support structure, wherein the support structure has a first area;
   defining an area of interest in the formed block copolymer, wherein the area of interest is smaller than the first area; and
   separating the block copolymers into hexagonally-spaced domains in a matrix only within the area of interest.

2. The method of claim 1, wherein the block copolymer comprises a diblock copolymer.

3. The method of claim 2, wherein the diblock copolymer comprises a block of polystyrene and another block selected from the group consisting of polybutadiene, polyisoprene, and polymethylmethacrylate.

4. The method of claim 1, wherein the domains have a domain spacing, and wherein the area of interest is defined to include a fixed number of formed domains.

5. The method of claim 1, wherein the area of interest is hexagonal.

6. The method of claim 1, wherein defining the area of interest comprises patterning the block copolymer.

7. The method of claim 1, wherein defining the area of interest comprises removing the block copolymer from the support structure except in the area of interest.

8. The method of claim 1, wherein separating the domains comprises heating the block copolymer to higher than a glass transition temperature of the block copolymer.

9. The method of claim 1, wherein the domains are comprised of a block of the block copolymer.

10. A method for processing a block copolymer, comprising, in order:
    forming the block copolymer over a support structure;
    patterning the block copolymer to define an area of interest in the formed block copolymer; and
    forming domains in the block copolymers only within the area of interest.

11. The method of claim 10, wherein the block copolymer comprises a diblock copolymer.

12. The method of claim 11, wherein the diblock copolymer comprises a block of polystyrene and another block selected from the group consisting of polybutadiene, polyisoprene, and polymethylmethacrylate.

13. The method of claim 10, wherein the domains have a domain spacing, and wherein the area of interest is patterned to include a fixed number of formed domains.

14. The method of claim 10, wherein the area of interest is hexagonal.

15. The method of claim 10, wherein patterning the block copolymer to define an area of interest comprises exposing the block copolymer with radiation outside of the area of interest.

16. The method of claim 15, wherein the exposed block copolymer is removed, and wherein domains are formed prior to the removal of the exposed block copolymer.

17. The method of claim 15, wherein the exposed block copolymer is removed, and wherein domains are formed after the removal of the exposed block copolymer.

18. The method of claim 10, wherein forming the domains comprises heating the block copolymer to higher than a glass transition temperature of the block copolymer.

19. The method of claim 10, wherein the domains are comprised of a block of the block copolymer.

20. A method for processing a block copolymer, comprising, in order:
    forming the block copolymer over a support structure;
    removing the block copolymer from the support surface outside of an area of interest; and
    forming domains in the block copolymers only within the area of interest.

21. The method of claim 20, wherein the block copolymer comprises a diblock copolymer.

22. The method of claim 21, wherein the diblock copolymer comprises a block of polystyrene and another block selected from the group consisting of polybutadiene, polyisoprene, and polymethylmethacrylate.

23. The method of claim 20, wherein the domains have a domain spacing, and wherein the area of interest is sized to include a fixed number of formed domains.

24. The method of claim 20, wherein the area of interest is hexagonal.

25. The method of claim 20, wherein removing the block copolymer comprises patterning the block copolymer outside of the area of interest.

26. The method of claim 20, wherein forming the domains comprises heating the block copolymer to higher than a glass transition temperature of the block copolymer.

27. The method of claim 20, wherein the domains are comprised of a block of the block copolymer.

28. A method for processing a block copolymer capable of forming domains having a domain spacing, comprising, in order:
providing the block copolymer within an area of interest on a support structure, having a first area, wherein the area of interest is smaller than the first area and defined in accordance with the domain spacing to include an integer number of domains; and
separating the block copolymers into hexagonally-spaced domains in a matrix to form the integer number of domains only within the area of interest 29. The method of claim 28, wherein the block copolymer comprises a diblock copolymer.

30. The method of claim 29, wherein the diblock copolymer comprises a block of polystyrene and another block selected from the group consisting of polybutadiene, polyisoprene, and polymethylmethacrylate.

31. The method of claim 28, wherein the area of interest is hexagonal.

32. The method of claim 28, wherein the area of interest is defined by patterning the block copolymer.

33. The method of claim 28, wherein providing the block copolymer only within an area of interest is performed by forming the block copolymer over the support structure and removing the block copolymer from the support structure except in the area of interest.

34. The method of claim 28, wherein separating the domains comprises heating the block copolymer to higher than a glass transition temperature of the block copolymer.

35. The method of claim 28, wherein the domains are comprised of a block of the block copolymer.

36. A method for using a block copolymer as an etch mask for a circuit layer in an integrated circuit, comprising, in order:
forming the block copolymer over a circuit layer of the integrated circuit to be etched;
using a mask to define an area of interest in the formed block copolymer; and
forming the block copolymers into polymer domains in a polymer matrix only within the area of interest;
removing the polymer domains, leaving the polymer matrix as a mask; and
selectively etching the circuit layer under the removed polymer domains to form holes in the circuit layer.

37. The method of claim 36, wherein the block copolymer comprises a diblock copolymer.

38. The method of claim 37, wherein the diblock copolymer comprises a block of polystyrene and another block selected from the group consisting of polybutadiene, polyisoprene, and polymethylmethacrylate.

39. The method of claim 36, wherein the domains have a domain spacing, and wherein the area of interest is defined to include a fixed number of formed domains.

40. The method of claim 36, wherein the area of interest is hexagonal.

41. The method of claim 36, wherein using the mask to define the area of interest comprises patterning the block copolymer.

42. The method of claim 36, wherein defining the area of interest comprises removing the block copolymer from the circuit layer of the integrated circuit except in the area of interest.

43. The method of claim 36, wherein forming the domains comprises heating the block copolymer to higher than a glass transition temperature of the block copolymer.

44. The method of claim 36, wherein the domains are comprised of a block of the block copolymer.

45. The method of claim 36, further comprising, after forming the block copolymers into polymer domains and prior to removing the polymer domains, treating the polymer domains to render them susceptible to removal.

46. The method of claim 45, wherein treating the polymer domains comprises exposing them to ozone.

47. A method for using a block copolymer as an etch mask for a circuit layer in an integrated circuit, comprising, in order:
forming the block copolymer over a circuit layer of the integrated circuit to be etched;
using a mask to define an area of interest in the formed block copolymer; and
forming the block copolymers into polymer domains in a polymer matrix only within the area of interest;
removing the polymer matrix, leaving the polymer domains as a mask; and
selectively etching the circuit layer under the removed polymer matrix to form dots in the circuit layer.

48. The method of claim 47, wherein the block copolymer comprises a diblock copolymer.

49. The method of claim 48, wherein the diblock copolymer comprises a block of polystyrene and another block selected from the group consisting of polybutadiene, polyisoprene, and polymethylmethacrylate.

50. The method of claim 47, wherein the domains have a domain spacing, and wherein the area of interest is defined to include a fixed number of formed domains.

51. The method of claim 47, wherein the area of interest is hexagonal.

52. The method of claim 47, wherein using the mask to define the area of interest comprises patterning the block copolymer.

53. The method of claim 47, wherein using the mask to define the area of interest comprises removing the block copolymer from the circuit layer of the integrated circuit except in the area of interest.

54. The method of claim 47, wherein forming the domains comprises heating the block copolymer to higher than a glass transition temperature of the block copolymer.

55. The method of claim 47, wherein the domains are comprised of a block of the block copolymer.

56. The method of claim 47, further comprising, after forming the block copolymers into polymer domains and prior to removing the polymer matrix, treating the polymer domains to render them resilient to removal.

57. The method of claim 56, wherein treating the polymer domains comprises exposing them to osmium.

* * * * *

UNITED STATES PATENT AND TRADEMARK OFFICE
CERTIFICATE OF CORRECTION

| | |
|---|---|
| PATENT NO. | : 7,625,694 B2 |
| APPLICATION NO. | : 10/840535 |
| DATED | : December 1, 2009 |
| INVENTOR(S) | : Eugene P. Marsh et al. |

It is certified that error appears in the above-identified patent and that said Letters Patent is hereby corrected as shown below:

In column 7, line 59, in Claim 1, delete "comprising" and insert -- comprising, --, therefor.

In column 7, line 66, in Claim 1, delete "copolymers" and insert -- copolymer --, therefor.

In column 8, line 27, in Claim 10, delete "copolymers" and insert -- copolymer --, therefor.

In column 8, line 60, in Claim 20, delete "copolymers" and insert -- copolymer --, therefor.

In column 9, line 17, in Claim 28, after "copolymer" insert -- only --.

In column 9, line 18, in Claim 28, delete "structure," and insert -- structure --, therefor.

In column 9, line 22, in Claim 28, delete "copolymers" and insert -- copolymer --, therefor.

In column 9, line 52, in Claim 36, delete "copolymers" and insert -- copolymer --, therefor.

In column 10, line 6, in Claim 42, delete "defining" and insert -- using the mask to define --, therefor.

In column 10, line 16, in Claim 45, delete "copolymers" and insert -- copolymer --, therefor.

In column 10, line 29, in Claim 47, delete "copolymers" and insert -- copolymer --, therefor.

In column 10, line 60, in Claim 56, delete "copolymers" and insert -- copolymer --, therefor.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,625,694 B2 | Page 1 of 1 |
| APPLICATION NO. | : 10/840535 | |
| DATED | : December 1, 2009 | |
| INVENTOR(S) | : Eugene P. Marsh et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1,227 days.

Signed and Sealed this

Nineteenth Day of October, 2010

David J. Kappos
*Director of the United States Patent and Trademark Office*